United States Patent
Chen et al.

(10) Patent No.: US 6,756,294 B1
(45) Date of Patent: Jun. 29, 2004

(54) METHOD FOR IMPROVING BUMP RELIABILITY FOR FLIP CHIP DEVICES

(75) Inventors: Yen-Ming Chen, Hsin-Chu (TW);
Chia-Fu Lin, Hsin-Chu (TW);
Shun-Liang Hsu, Hsin-Chu (TW);
Kai-Ming Ching, Taiping (TW);
Hsin-Hui Lee, Kaohsiung (TW);
Chao-Yuan Su, Kaohsiung (TW);
Li-Chih Chen, Taipei (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 160 days.

(21) Appl. No.: 10/060,483

(22) Filed: Jan. 30, 2002

(51) Int. Cl.⁷ .............................................. H01L 21/44
(52) U.S. Cl. ..................... 438/612; 438/614; 438/618
(58) Field of Search ................. 438/612, 613, 438/614, 618, 665, 108; 257/738

(56) References Cited

U.S. PATENT DOCUMENTS

| | | | |
|---|---|---|---|
| 5,543,253 A | 8/1996 | Park et al. | 439/5 |
| 6,042,996 A | 3/2000 | Lin et al. | 430/313 |
| 6,118,180 A | 9/2000 | Loo et al. | 257/737 |
| 6,130,141 A | 10/2000 | Degani et al. | 438/455 |
| 6,153,503 A | 11/2000 | Lin et al. | 438/613 |
| 6,232,212 B1 | 5/2001 | Degani et al. | 438/612 |
| 6,426,281 B1 * | 7/2002 | Lin et al. | 438/612 |
| 6,426,556 B1 * | 7/2002 | Lin | 257/738 |
| 6,452,270 B1 * | 9/2002 | Huang | 257/738 |

* cited by examiner

Primary Examiner—Long Pham
Assistant Examiner—(Vikki) Hoa B. Trinh
(74) Attorney, Agent, or Firm—George O. Saile; Stephen B. Ackerman

(57) ABSTRACT

A new method is provided for the creation of a solder bump. Conventional methods are initially followed, creating a patterned layer of Under Bump Metal over the surface of a contact pad. A layer of photoresist is next deposited, this layer of photoresist is patterned and developed creating a resist mask having a T-shape opening aligned with the contact pad. This T-shaped opening is filled with a solder compound, creating a T-shaped layer of solder compound on the surface of the layer of UBM. The layer of photoresist is removed, exposing the Created T-shaped layer of solder compound, further exposing the layer of UBM. The layer of UBM is etched using the T-shaped layer of solder compound as a mask. Reflow of the solder compound results in creating a solder ball.

26 Claims, 5 Drawing Sheets

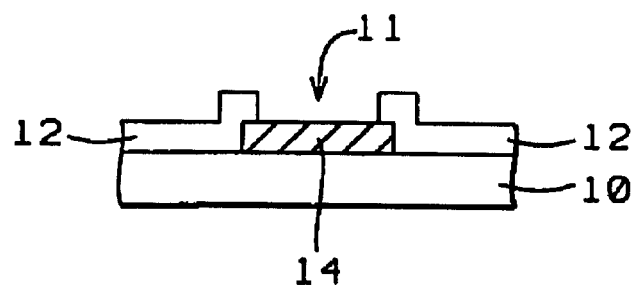
FIG. 1 - Prior Art
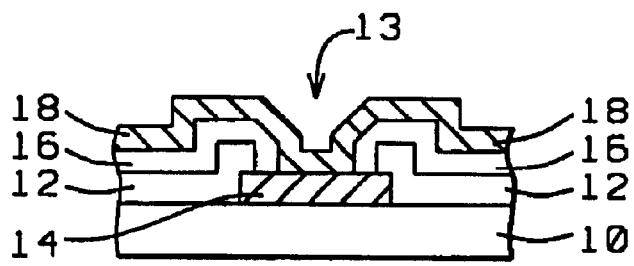
FIG. 2 - Prior Art
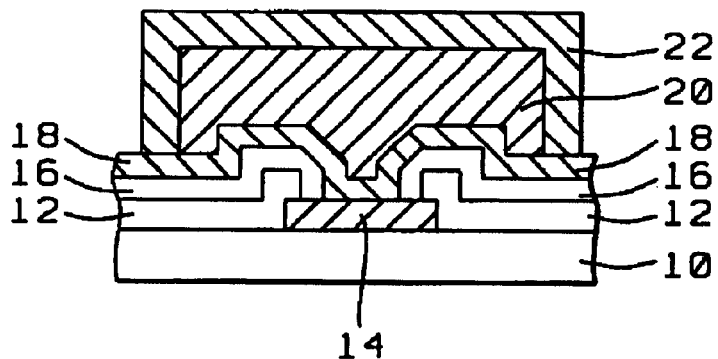
FIG. 3 - Prior Art
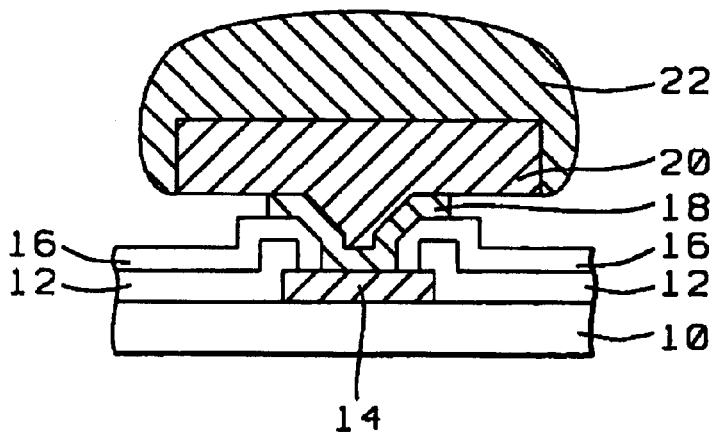
FIG. 4 - Prior Art

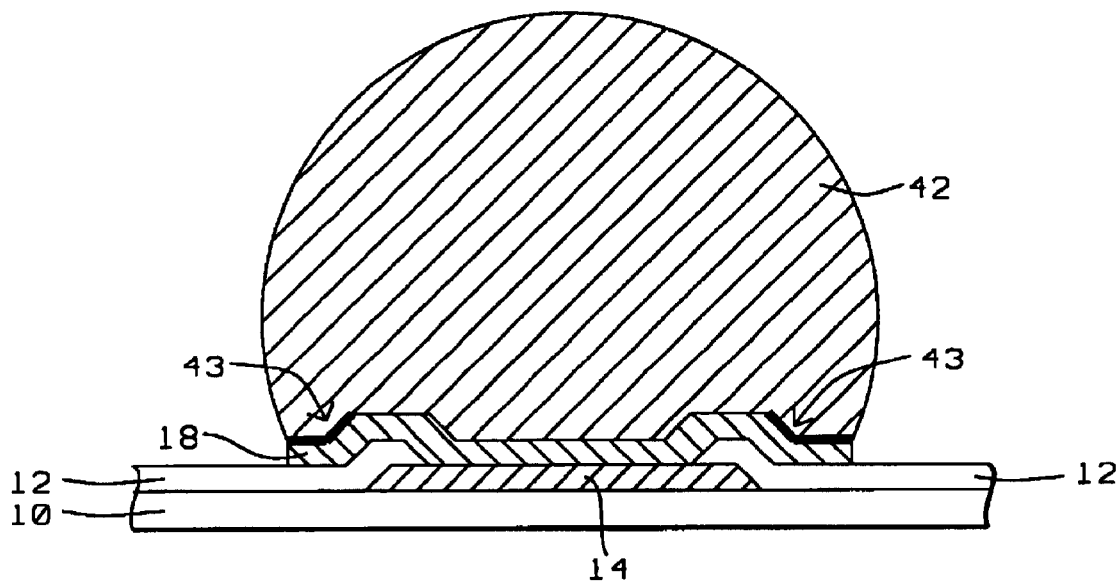
FIG. 13 - Prior Art
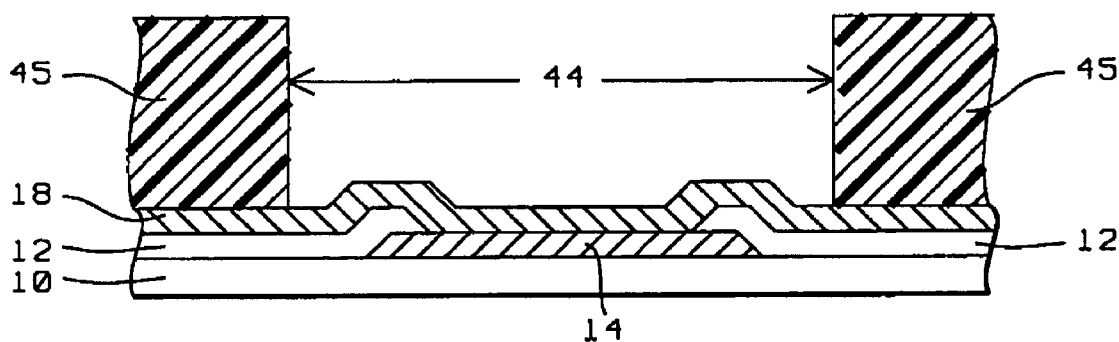
FIG. 14 - Prior Art

METHOD FOR IMPROVING BUMP RELIABILITY FOR FLIP CHIP DEVICES

BACKGROUND OF THE INVENTION (1) Field of the Invention

The invention relates to the fabrication of integrated circuit devices, and more particularly, to a method for improving the height of an interconnect bump for small pad design.

(2) Description of the Prior Art

Continued decrease in semiconductor device feature size has led to a significant increase in semiconductor device density, which places increased emphasis on device or package I/O capabilities. The metal connections, which connect the Integrated Circuit to other circuits or to system components, have therefore become more important and can, with further miniaturization of the semiconductor device, have an increasingly negative impact on circuit performance.

One of the approaches that has been taken to solve these packaging problems is to design chips and chip packaging techniques that offer dependable methods of increased interconnecting of chips at a reasonable manufacturing cost. This has led to the development of Flip Chip Packages.

Flip-chip technology fabricates bumps (typically Pb/Sn solders) on Al pads on the chips and interconnects the bumps directly to the package media, which are usually ceramic or plastic based. The flip-chip is bonded face down to the package medium through the shortest paths. These technologies can be applied not only to single-chip packaging, but also to higher or integrated levels of packaging in which the packages are larger, and to more sophisticated substrates that accommodate several chips to form larger functional units.

The flip-chip technique, using an array of I/O interconnects, has the advantage of achieving the highest density of interconnection to the device combined with a very low inductance interconnection to the package. Prior Art substrate packaging uses ceramic and plastic flip chip packaging. Ceramic substrate packaging is expensive and has proven to limit the performance of the overall package. Recent years has seen the emergence of plastic substrate flip chip packaging, this type of packaging has become the main-stream design and is frequently used in high volume flip chip package fabrication. The plastic substrate flip chip package performs satisfactorily when used for low-density flip chip Integrated Circuits (IC's). If the number of pins emanating from the IC is high, that is in excess of 350 pins, or if the number of pins coming from the IC is less than 350 but the required overall package size is small, the plastic flip chip structure becomes complicated and expensive. This multi-layer structure results in a line density within the package of typically a 2–3 mil range. This line density is not sufficiently high for realizing the fan-out from the chip I/O to the solder balls on the package within a single layer, leading to the multi-layer approach. The multi-layer approach brings with it the use of relatively thick (50 to 75 $\mu$m) dielectric layers, these layers have a Coefficient of Thermal Expansion (CTE) that is considerably higher than the CTE of the laminate board on which the plastic flip chip package is mounted. To counteract this difference in the CTE, the overall package must be (thermally and mechanically) balanced resulting in the use of additional material and processing steps to apply these materials, increasing the cost of the Ball Grid Array (BGA) package and creating a yield detractor.

In creating semiconductor devices, the technology of interconnecting devices and device features is a continuing challenge in the era of sub-micron devices. Bond pads and solder bumps are frequently used for this purpose, whereby continuous effort is dedicated to creating bond pads and solder bumps that are simple, reliable and inexpensive. The invention provides a method of creating solder bumps of increased height, thereby improving interconnect reliability while not adding to the processing cost of creating the interconnect bumps.

U.S. Pat. No. 5,543,253 (Park et al.) shows a dual damascene like Photo process for a T-gate.

U.S. Pat. No. 6,042,996 (Lin et al.) shows a dual damascene process.

U.S. Pat. No. 6,232,212 (Degani et al.), U.S. Pat. No. 6,153,503 (Lin et al.), U.S. Pat. No. 6,130,141 (Degani et al.) and U.S. Pat. No. 6,118,180 (Loo et al. show related Bump and UBM processes.

SUMMARY OF THE INVENTION

A principle objective of the invention is to provide a method of creating solder bumps while improving the solder bump height without changing the size of the Under Bump Metal.

Another objective of the invention is to provide a method of creating solder bumps that allows for increasing the bump height for applications where the solder bump is created over a small contact pad.

Yet another objective of the invention is to provide a method of creating solder bumps that allows for improved control over the height of the solder bump.

A still further objective of the invention is to provide a method of creating an improved solder bump that does not add to the cost of creating a solder bump.

In accordance with the objectives of the invention a new method is provided for the creation of a solder bump. Conventional methods are initially followed, creating a patterned layer of Under Bump Metal over the surface of a contact pad. A layer of photoresist is next deposited, this layer of photoresist is patterned and developed creating a resist mask having a T-shape opening aligned with the contact pad. This T-shaped opening is filled with a solder compound, creating a T-shaped layer of solder compound on the surface of the layer of UBM. The layer of photoresist is removed, exposing the created T-shaped layer of solder compound, further exposing the layer of UBM. The layer of UBM is etched using the T-shaped layer of solder compound as a mask. Reflow of the solder compound results in creating a solder ball.

BRIEF DESCRIPTION OF THE DRAWINGS

FIGS. 1 through 4 show a cross section of a prior art processing sequence to form interconnect bumps, as follows:

FIG. 1 shows a cross section of a semiconductor surface on the surface of which a contact pad has been created, the semiconductor surface is covered with a patterned layer of passivation, FIG. 2 shows the cross section of FIG. 1 after a patterned layer of dielectric and a layer of metal have been created on the semiconductor surface, FIG. 3 shows a cross section of FIG. 2 after a layer of interconnect metal and a layer of solder compound have been selectively deposited, and FIG. 4 shows a cross section after excess layers have been removed from the semiconductor surface and after the solder has been flowed, forming the interconnect bump.

FIG. 5 shows a cross section of a semiconductor surface on the surface of which a contact pad has been created, the semiconductor surface is covered with a layer of passivation, a layer of UBM has been deposited.

FIG. 6 shows a cross section after a layer of photoresist has been created over the surface of the layer of UBM.

FIG. 7 shows a cross section during the exposure of the layer of photoresist.

FIG. 8 shows a cross section after development of the layer of photoresist.

FIG. 9 shows a cross section after the opening that has been created in the layer of photoresist has been filled with solder.

FIG. 10 shows a cross section after the layer of photoresist has been removed, creating a patterned solder layer.

FIG. 11 shows a cross section after the layer of UBM has been etched using the patterned solder layer as an etch mask.

FIG. 12 shows a cross section after the T-shaped pattern of solder compound has been heat treated, flowing the solder compound.

FIGS. 13 and 14 show a prior art solder bump, highlighting problems that are typically experienced in creating such a solder bump.

DESCRIPTION OF THE PREFERRED EMBODIMENTS

Figure 5:
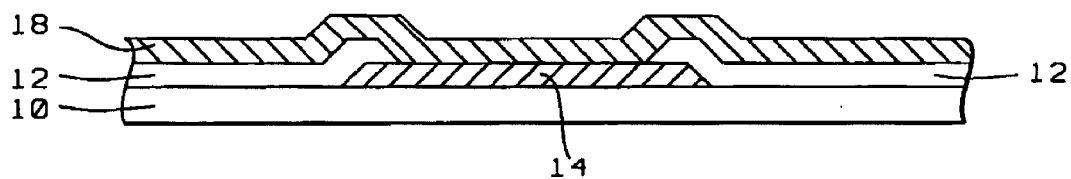
FIGS. 5 through 12 show the process of the invention, e as follows.

FIG. 1 shows an example of one of the conventional methods that can be used to create an interconnect bump.

A semiconductor surface 10 has been provided with a metal contact pad 14, the semiconductor surface 10 is protected with a layer 12 of passivation. An opening 11 has been created in the layer 12 of passivation, the surface of the metal contact pad 14 is exposed through this opening 11.

Next, as shown in the cross section of FIG. 2, a dielectric layer 16 is deposited over the surface of the layer 12 of passivation. The layer 16 of dielectric is patterned and etched, creating an, opening 13 in the layer 16 of dielectric that aligns with the metal pad 14 and that exposes the surface of the metal pad 14.

A layer of 18 of metal, also shown in the cross section of FIG. 2, typically created by applying Under Bump Metallurgy (UBM), is deposited over the layer 16 of dielectric, this layer 18 of metal is in contact with the metal pad 14 inside opening 13. The layer 18 of metal that is above the metal pad 14 will, at a later point in the process, form a pedestal over which an interconnect bump will be formed.

This pedestal can further be extended in height by the deposition and patterning of one or more additional layers (underlying the pedestal 18 shown in the cross section of FIG. 2) that may contain a photoresist or a dielectric material. These additional layers have not been shown in FIG. 2 but essentially have the shape of layer 16 and can be removed during one of the final processing steps that are applied for the formation of the interconnect bump.

A layer 20 of metal, such as copper or nickel or Cu/Ni, FIG. 3, that forms an integral part of the to be created interconnect bump, is next electroplated on the surface of the layer 18 of metal. Layer 18 serves as the lower electrode during the plating process. The final layer 22 of solder is electroplated on the surface of layer 20. The creation of layer 22 of solder is not limited to using methods of electroplating but can also be created using methods of printing and evaporation.

The layer 18 of metal is next etched, FIG. 4, leaving in place only the pedestal for the interconnect bump. During this etch process the deposited layers 20 and 22 serve as a mask. If, as indicated above, additional layers of dielectric or photoresist have been deposited for the further shaping of pedestal 18 in FIG. 4, these layers are also removed at this time.

A solder paste or flux is now applied to the layer 22 of solder, the solder 22 is melted in a reflow furnace typically under a nitrogen atmosphere, creating the spherically shaped interconnect bump 22 that is shown in FIG. 4.

The above processing steps are in many of the applications of the indicated process augmented by processing steps of curing and pre-baking in order to improve hardness and other desirable performance parameters of the various layers that are used for the processing sequence that has been described in FIGS. 1 through 4. For instance, a layer of photoresist that is used as part of the processing sequence can be pre-baked prior to the exposure and etching of the photoresist layer. These steps have not been included in the above description for reasons of simplicity of description.

In addition to the above indicated additional layers of dielectric or photoresist that can be used to further shape the pedestal of the interconnect bump, many of the applications that are aimed at creating interconnect bumps make use of layers of metal that serve as barrier layers or that have other specific purposes such as the improvement of adhesion of the various overlying layers or the prevention of diffusion of materials between adjacent layers. These layers collectively form layer 18 of FIG. 2 and have, as is clear from the above, an effect on the shape of the completed bump and are therefore frequently referred to as Ball Limiting Metal (BLM) layer. Frequently used BLM layers are successive and overlying layers of chrome, copper and gold, whereby the chrome is used to enhance adhesion with an underlying aluminum contact pad, the copper layer serves to prevent diffusion of solder materials into underlying layers while the gold layer serves to prevent oxidation of the surface of the copper layer. Layer 18 of FIGS. 2 through 4 represents the BLM layer.

Increased device density brings with it increased closeness of components and elements that are part of the created semiconductor devices. This increased closeness is expressed as a reduction in the spacing or "pitch" between elements of a semiconductor device. State-of-the-art technology uses solder bumps having a pitch of about 200 $\mu$m, which imposes a limitation on further increasing device density. The limitation in further reducing the pitch of solder bumps is imposed by concerns of reliability, which impose a relatively large ball size for the solder bump. This relatively large solder ball restricts further reducing the solder ball pitch.

In the majority of applications, solder bumps are used as interconnections between I/O bond pads and a substrate or printed circuit board. Large solder balls bring with it high standoff since a solder ball with high standoff has better thermal performance (CTE mismatching is easier to avoid resulting in reduced thermal stress on the solder balls). Large solder balls are therefore required in order to maintain interconnect reliability. Low-alpha solder is applied to avoid soft error (electrical or functional errors) from occurring, thereby eliminating the potential for inadvertent memory discharge and incorrect setting of a voltage (1 or 0).

It is well known in the art that the bump height is a critical parameter affecting reliability of the flip chip interconnect package. Directly related to the bump height is the bump diameter or size. In addition, for high-density chip design, the size of the UBM is limited by the size of the pad over which the solder bump is created. When applying "straight wall" photoresist technology for the creation of UBM layers and layers that are associated with the creation of a solder bump, the UBM height is limited by the UBM size. As an alternative, a mushroom design has been proposed for the creation of the solder bump without increasing the UBM size. This approach however is difficult to implement in view of a number of reliability problems that are encountered using a mushroom solder bump construction.

The invention addresses the concern of solder bump reliability for sub-miniature device dimensions by creating a dual straight wall using a photoresist mask, which has cooperative parts of different transparency, resulting in an increased bump height while not affecting the UBM size.

FIG. 5 shows across section of a semiconductor surface on which a contact pad 14 has been provided, a layer 12 of passivation has been deposited over the semiconductor surface 10 and has been patterned and etched, exposing the surface of the aluminum pad 14. Contact pad 14 over surface 10 is typically electrically connected with a semiconductor device with at least one conductive line of interconnect or with at least one conductive contact point (not shown).

Surface 10 is not limited to the surface of a substrate but may also a surface of printed circuit boards and flex circuits and a metallized or glass substrate and a semiconductor device mounting support.

In-situ sputter clean has been performed of the exposed surface of the contact pad 14. A seed layer (not shown in FIG. 5) has been blanket deposited over the surface the layer 12 of passivation, including the exposed surface of the contact pad 14, a film 18 of Under Ball Metallurgy has been blanket deposited over the seed layer.

Insulating/passivation layers such as silicon oxide and oxygen-containing polymers are deposited over the surface of various layers of conducting lines in a semiconductor device or substrate to separate the conductive interconnect lines from each other, the insulating layers can be deposited using Chemical Vapor Deposition (CVD) techniques. The insulating layers are deposited over patterned layers of interconnecting lines where electrical contact between successive layers of interconnecting lines is established with metal vias created for this purpose in the insulating layers. Electrical contact to the chip is typically established by means of bond pads or contact pads that form electrical interfaces with patterned levels of interconnecting metal lines. Signal lines and power/ground lines can be connected to the bond pads or contact pads.

After the bond pads or contact pads have been created on the surfaces of the chip package, the bond pads or contact pads are passivated and electrically insulated by the deposition of a passivation layer over the surface of the bond pads. A passivation layer can contain silicon oxide/silicon nitride ($SiO_2/Si_3N_4$) deposited by CVD.

The passivation layer is patterned and etched to create openings in the passivation layer for the bond pads or contact pads after which a second and relatively thick passivation layer can be deposited for further insulation and protection of the surface of the chips from moisture and other contaminants and from mechanical damage during assembling of the chips.

Various materials have found application in the creation of passivation layers. Passivation layer can contain silicon oxide/silicon nitride ($SiO_2/Si_3N_4$) deposited by CVD, a passivation layer can be a layer of photosensitive polyimide or can comprise titanium nitride. Another material often used for a passivation layer is phosphorous doped silicon dioxide that is typically deposited over a final layer of aluminum interconnect using a Low Temperature CVD process. In recent years, photosensitive polyimide has frequently been used for the creation of passivation layers. Conventional polyimides have a number of attractive characteristics for their application in a semiconductor device structure, which have been highlighted above. Photosensitive polyimides have these same characteristics but can, in addition, be patterned like a photoresist mask and can, after patterning and etching, remain on the surface on which it has been deposited to serve as a passivation layer. Typically and to improve surface adhesion and tension reduction, a precursor layer is first deposited by, for example, conventional photoresist spin coating. The precursor is, after a low temperature pre-bake, exposed using, for example, a step and repeat projection aligner and Ultra Violet (UV) light as a light source. The portions of the precursor that have been exposed in this manner are cross-linked, thereby leaving unexposed regions (that are not cross-linked) over the bond pads. During subsequent development, the unexposed polyimide precursor layer (over the bond pads) is dissolved, thereby providing openings over the bond pads. A final step of thermal curing leaves a permanent high quality passivation layer of polyimide over the substrate.

The preferred material of the invention for the deposition of layer 12 of passivation is Plasma Enhanced silicon nitride (PE $Si_3N_4$), deposited using PECVD technology at a temperature between about 350 and 450 degrees C. with a pressure of between about 2.0 and 2.8 Torr for the duration between about 8 and 12 seconds. Layer 12 of PE $Si_3N_4$ can be deposited to a thickness between about 200 and 800 Angstrom.

Layer 12 of passivation material, deposited over the semiconductor surface 10, can also comprise a plurality of passivation layers, providing improved protection to underlying surfaces. This plurality of passivation layers can for instance be selected from a group comprising PE $Si_3N_4$, $SiO_2$, a photosensitive polyimide, phosphorous doped silicon dioxide and titanium nitride.

Layer 12 of PE $Si_3N_4$ is next patterned and etched to create an opening in the layer 12 that overlays and aligns with the underlying contact pad 12.

For an in-situ sputter clean of the exposed surface of contact pad 14, a sputter ion-milling tool can be used, applying Ar mixed with $H_2$ as a cleaning agent (sputter source).

For the seed layer that is blanket deposited over the surface of the layer 12 of passivation, including the exposed surface of the contact pad 14, any of the conventional metallic seed materials can be used. The metallic seed layer can be deposited using a sputter chamber or an Ion Metal Plasma (IMP) chamber at a temperature of between about 0 and 300 degrees C. and a pressure of between about 1 and 100 mTorr, using (for instance) copper or a copper alloy as the source (as highlighted above) at a flow rate of between about 10 and 400 sccm and using argon as an ambient gas.

Layer 18 of UBM has been deposited by vacuum evaporation, this layer is as yet to be patterned and etched. Layer 18 may, as previously indicated, contain multiple layers of metal such as the previously cited layers of chrome, followed by a layer of copper, followed by a layer of gold.

Although layer 18 has been shown in cross section in FIG. 5 as one layer of metal, the term UBM is at times used generically to refer to all metal that is interposed between the solder bump and the underlying contact pad 14 Examples will be given at a later time how the layer of UBM, as used in accordance with the generic description, can be created. The invention provides a method of creating the (generically referred to and therefore potentially comprising a number of layers of metal) solder bump by creating a tapered profile in an overlying layer of photoresist. The opening can be made to taper into a narrower opening when proceeding from the top of the opening to the bottom of the opening. This will be further explained in the following drawings.

A layer 18 of UBM metal can for instance comprise a layer of chromium followed by a layer of copper followed by a layer of gold or a layer of chromium followed by a layer of copper followed by a layer of gold. A layer of UBM metal can also comprise a plurality of sub-layers of different metallic composition.

Figure 6:
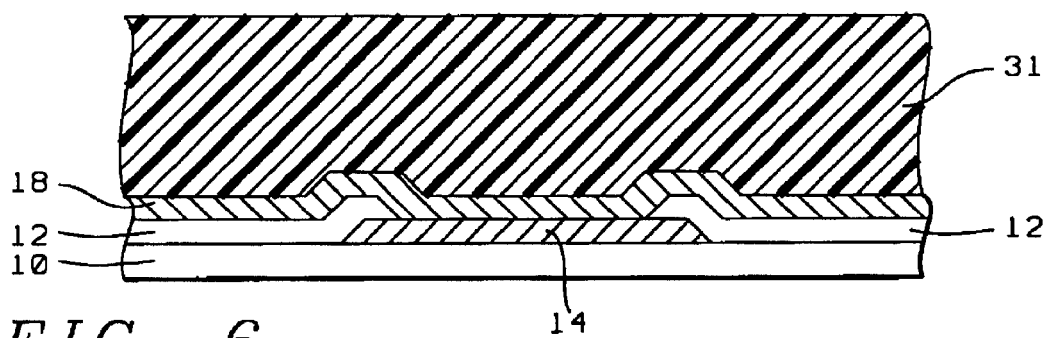

FIG. 6 shows a cross section after a layer 31 of dry film photoresist has been deposited over the surface of UBM layer 18.

Figure 7:
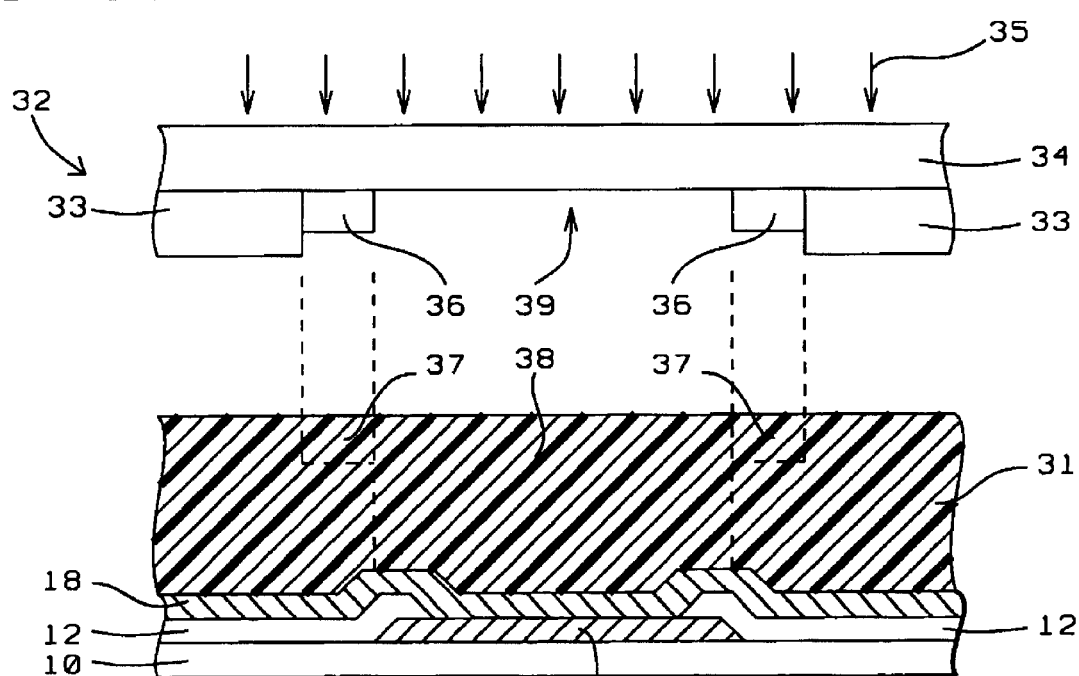

FIG. 7 shows a cross section during the exposure of the layer 31 of photoresist. Exposure mask 32 is used for this exposure, on quartz substrate 34 of mask 32 are two concentric patterns 33 (a first pattern) and 36 (a second pattern) of opaque material, making mask 32 a grey-tone mask.

Where second pattern 36 overlies the surface of the quartz substrate of the mask 32, this layer 36 of opaque material has a height that is less than the height of the first pattern 33. Pattern 36 bounds a surface area 39 of the quartz substrate 34 where no opaque material is deposited over the quartz substrate, allowing all light 35 to pass through the mask 32 and to strike the surface of the layer 31 of photoresist. Radiation 35, of typical photolithographic exposure, therefore exposes the surface of layer 31 in a gradated manner. Light of exposure 35 will penetrate the layer 31 to a limited depth through the surface area 37 while light 35 will completely penetrate the layer 31 of photoresist in the region that has been highlighted as region 38. The photoresist will therefore be prepared for removal in accordance with the layers of photoresist that ate enclosed in regions 37 and 38.

Figure 8:
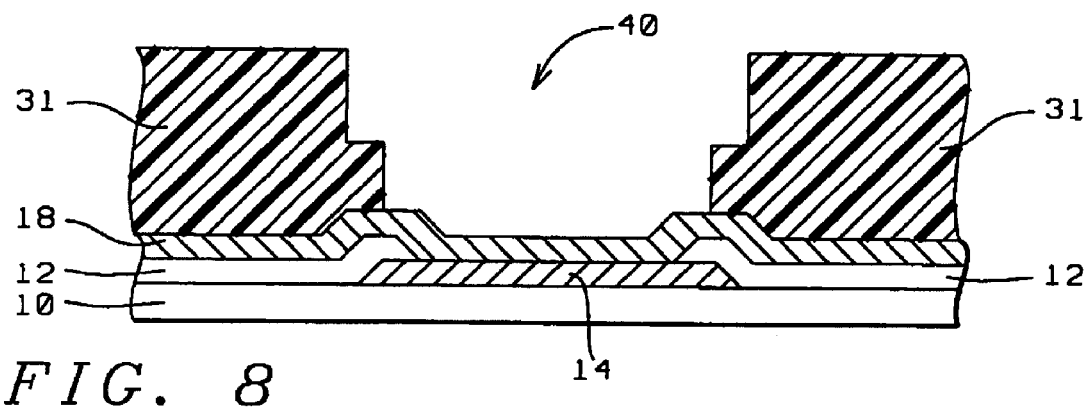
Figure 9:
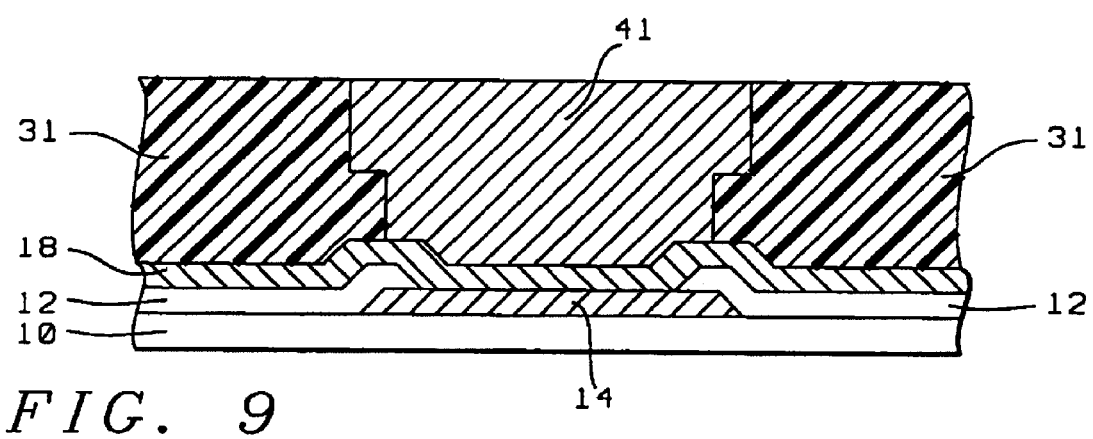
Figure 10:
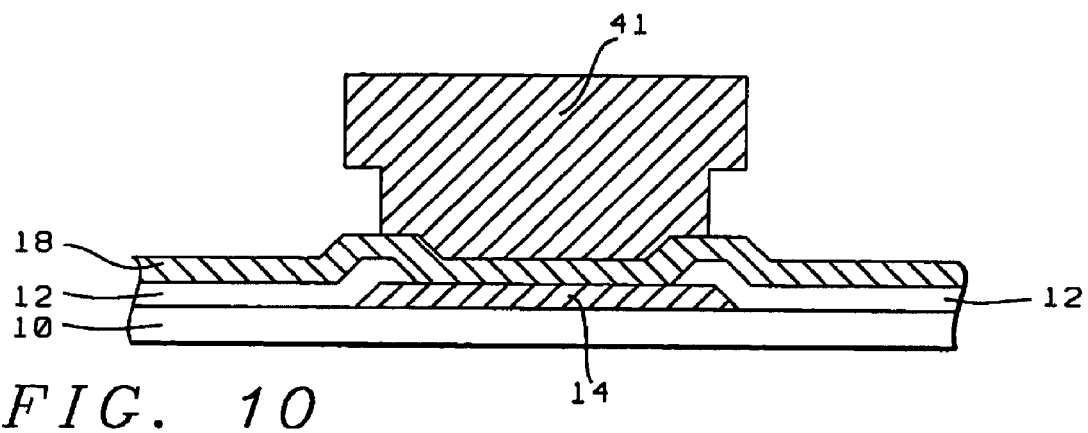
Figure 11:
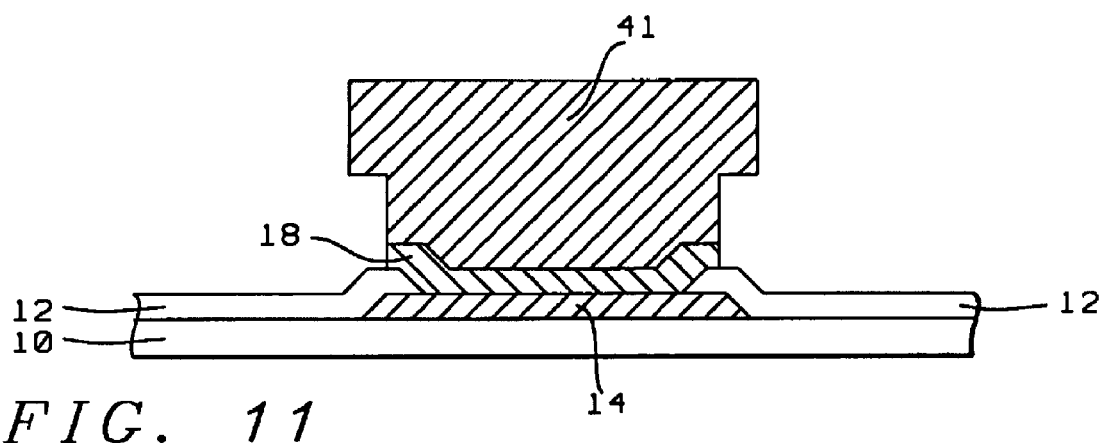
Figure 12:
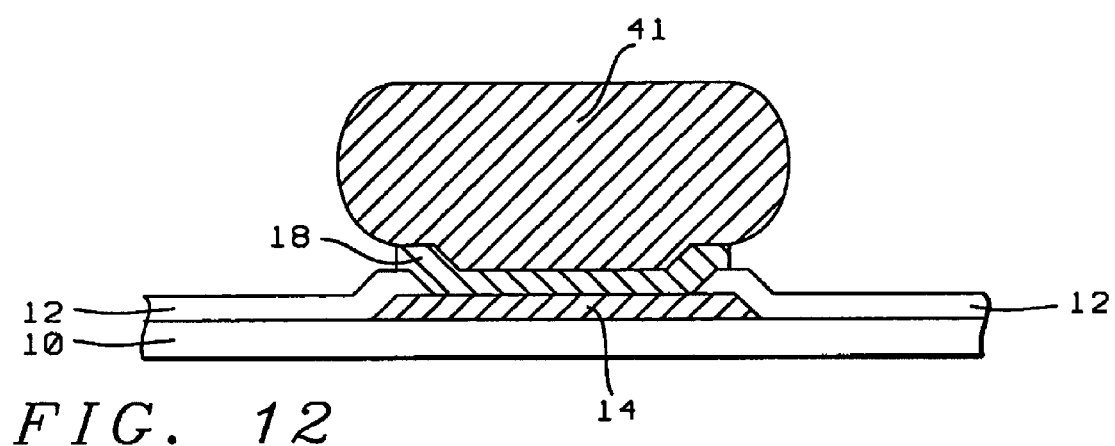

FIG. 8 shows a cross section of the structure after the layer 31 of photoresist has been removed in accordance with the exposure that has been affected using mask 32, creating opening 40 in the layer 31 of photoresist. Opening 40 is next filled with layer 41 of solder, FIG. 9, the deposited solder fills opening 40 and overlies the surface of layer 31. The overlying solder is removed from the surface of layer 31, resulting in the cross section that is shown in FIG. 9. The removal of layer 31 of photoresist results in the cross section that is shown in FIG. 10. A patterned layer 41 of solder or solder compound remains in place over the surface of layer 18 of UBM, layer 41 has a T-shape. The removal of layer 31 exposes the surface of layer 18 of UBM, this layer 18 is next etched using the solder plug 41 as a mask. The results of this latter etch are shown in cross section in FIG. 11.

The reasons that the T-shape of the created layer 41 is of benefit can be explained as follows. If the surface area of the patterned layer of UBM is larger than the surface area of the contact pad, die cracks 43, shown in the cross section of FIG. 13, are likely to occur between the solder bump 42 and the underlying layer 18 of UBM. By limiting the size of the surface area of the layer of UBM to the same size as the size the surface area of the contact pad, cracking can be prevented. However, limiting the surface area of the patterned layer of UBM layer underlying the solder bump leads to limiting the size of the solder bump. By therefore creating a T-shaped solder form, more solder can be deposited, thereby creating a larger solder bump without creating a layer of UBM as the footprint of the solder bump.

It must be pointed out that the patterning and etching of layer 18 of UBM can be extended by leaving the layer 18 of UBM in place above and extending from above the contact pad 14 by a measurable amount, simultaneously creating conductive interconnect lines on the surface of the layer 12 of passivation. The conductive interconnect lines can be used to make contact with contact pads-over substrate 10 by creating openings in the layer 12 of passivation that align with at least one contact pad over the surface of substrate 10.

From the processing sequence that has been shows in FIGS. 5 through 12, it is clear the invention has provided for:
improved bump height without changes the size of the UBM
the ability to increase the bump height while maintaining small contact pad surface, and
the ability to control and adjust the height of the solder bump.

The above-summarized advantages of the invention are provided without the need for extra processing steps in creating a solder bump.

FIGS. 13 and 14 further highlight a typical problem that is experience with prior art methods of creating a solder bump. The conventional layers such as 10, 12, 14 and 18, have been highlighted in the cross section of FIG. 13, solder ball 42 has been created over the surface of these layers applying previously highlighted methods. Regions that are highlighted as regions 43 are the interface surfaces between the solder bump 42 and the underlying layer 11 of UBM where typically cracks occur in the structure, leading to concerns of reliability. The reason for the occurrence of cracks in regions 43 is highlighted in the cross section that is shown in FIG. 14, Dimension 44 is too small for applications where the size of the overlying layer 18 of UBM is smaller than the surface region of the pad 14.

Although the invention has been described and illustrated with reference to specific illustrative embodiments thereof, it is not intended that the invention be limited to those illustretive embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method to create a solder bump for interconnection of flip chip devices, comprising the steps of:

providing a substrate, at least contact pad having been provided over said substrate, a layer of passivation having been deposited over said substrate, said layer of passivation having been patterned, exposing said at least one contact pad, a layer of Under-Bump-Metallurgy (UBM) having been deposited over said layer of passivation including the exposed said at least one contact pad;

creating at least one T-shaped layer of solder compound over said layer of UBM in at least one opening created in a layer of patterning material, said at least one T-shaped layer of solder compound being aligned with said at least one contact pad having been provided over said substrate, said creating at least one T-shaped layer of solder compound over said layer of UBM comprising:

(i) depositing said layer of patterning material over said layer of UBM; and (ii) patterning and developing said layer of patterning material using a grey-tone mask;

removing said layer of patterning material, leaving in place said at least one T-shaped layer of solder compound, exposing said layer of UBM;

etching said exposed layer of UBM using said at least one T-shaped layer of solder compound as a mask; and reflowing said solder compound, creating said solder bump.

2. The method of claim 1, said layer of patterning material comprising photoresist.

3. The method of claim 1, said layer of Under Bump Metallurgy comprising a layer of chromium followed by a layer of copper followed by a layer of gold.

4. The method of claim 1, said layer of Under Bump Metallurgy comprising a plurality of sub-layers of different metallic composition.

5. The method of claim 1, said passivation layer deposited over said semiconductor surface comprising a plurality of passivation layers.

6. The method of claim 5, at least one of said plurality of passivation layers being selected from the group consisting of PE $Si_3N_4$ and $SiO_2$ and a photosensitive polyimide and phosphorous doped silicon dioxide and titanium nitride.

7. The method of claim 1, said at least one contact pad on said semiconductor substrate being electrically connected with a semiconductor device with at least one conductive line of interconnect or with at least one conductive contact point.

8. The method of claim 1, said at least one contact pad on said semiconductor substrate further being expanded to include a contact pad that is formed on a surface that is selected from the group of surfaces consisting of printed circuit boards and flex circuits and a metallized or glass substrate and a semiconductor device mounting support.

9. The method of claim 1 with an additional step of applying a solder flux to said solder compound, said additional step being performed immediately prior to said reflowing said solder compound.

10. The method of claim 1, said step of patterning and etching said layer of UBM being further expanded, leaving said layer of UBM in place above and extending from above said at least one contact pad, simultaneously creating conductive interconnect lines on said layer of passivation, said conductive interconnect lines making contact with at least one contact pad on said semiconductor substrate by creating openings in said layer of passivation that align with at least one contact pad on said semiconductor substrate.

11. The method of claim 1 wherein said grey-tone mask comprises:

at least one pattern of two concentric patterns of opaque material, said at least one pattern of two concentric patterns comprising a first pattern and a second pattern;

said first pattern of said two concentric patterns of opaque material being a pattern that surrounds said second pattern, said first pattern having a first thickness;

said second pattern of said two concentric patterns surrounding a transparent surface area of said grey-tone mask, said transparent surface area being aligned with said at least one contact pad provided on said substrate, said second pattern having a second thickness; and said first thickness being larger than said second thickness.

12. The method of claim 1, with an additional step of performing an in-situ sputter clean of inside surfaces of said at least one opening having a T-shape created through said layer of patterning material.

13. The method of claim 12, with an additional step of depositing a seed layer over inside surfaces of said at least one opening having a T-shape created through said layer of patterning material.

14. A method to create a solder bump for interconnection of flip chip devices, comprising the steps of:

providing a substrate, active semiconductor devices having been created in or on said substrate;

creating at least one contact pad over said substrate;

depositing a layer of passivation over said substrate, including said at least one contact pad;

patterning said layer of passivation, exposing said at least one contact pad;

depositing a layer of Under-Bump-Metallurgy (UBM) over said layer of passivation, including said at least one contact pad;

depositing a layer of exposure sensitive material over said layer of UBM;

patterning said layer of exposure sensitive material, creating at least one opening having a T-shaped cross section through said exposure sensitive material, said at least one opening being aligned with said at least one contact pad created over said substrate, said creating at least one opening having a T-shaped cross section through said exposure sensitive material comprising:

(i) depositing said layer of exposure sensitive material over said layer of UBM; and (ii) patterning and developing said layer of exposure sensitive material using a grey-tone mask;

filling said at least one opening created through said exposure sensitive material with a solder compound;

removing said exposure sensitive material from said layer of UBM, leaving in place at least one T-shaped layer of solder compound, exposing said layer of UBM;

etching said layer of UBM, using said at least one T-shaped layer of solder compound as a mask; and reflowing said at least one T-shaped layer of solder compound.

15. The method of claim 14, said layer of exposure sensitive material comprising photoresist.

16. The method of claim 14, said layer of Under Bump Metallurgy comprising a layer of chromium followed by a layer of copper followed by a layer of gold.

17. The method of claim 14, said layer of Under Bump Metallurgy comprising a plurality of sub-layers of different metallic composition.

18. The method of claim 14, said passivation layer deposited over said semiconductor surface comprising a plurality of passivation layers.

19. The method of claim 18, at least one of said plurality of passivation layers being selected from the group consisting of PE $Si_3N_4$ and $SiO_2$ and a photosensitive polyimide and phosphorous doped silicon dioxide and titanium nitride.

20. The method of claim 14, said at least one contact pad on said semiconductor surface being electrically connected with a semiconductor device with at least one conductive line of interconnect or with at least one conductive contact point.

21. The method of claim 14, said at least one contact pad on said semiconductor substrate further being expanded to include a at least one contact pad that is formed on a surface that is selected from the group of surfaces consisting of printed circuit boards and flex circuits and a metallized or glass substrate and a semiconductor device mounting support.

22. The method of claim 14, with an additional step of applying a solder flux to said solder compound, said additional step being performed immediately prior to said reflowing said solder compound.

23. The method of claim 14, said step of patterning and etching said layer of UBM being further expanded, leaving said layer of UBM in place above and extending from above said at least one contact pad by a measurable amount, simultaneously creating conductive interconnect lines on said layer of passivation, said conductive interconnect lines making contact with at least one contact pad on said semiconductor substrate by creating openings in said layer of passivation that align with at least one contact pad on said semiconductor substrate.

24. The method of claim 14 wherein said grey-tone mask comprises:

at least one pattern of two concentric patterns of opaque material, said at least one pattern of two concentric patterns comprising a first pattern and a second pattern;

said first pattern of said two concentric patterns of opaque material being a pattern that surrounds said second pattern, said first pattern having a first thickness;

said second pattern of said two concentric patterns surrounding a transparent surface area of said grey-tone mask, said transparent surface area being aligned with said at least one contact pad provided on said substrate, said second pattern having a second thickness; and said first thickness being larger than said second thickness.

25. The method of claim 14, with an additional step of performing an in-situ sputter clean of inside surfaces of said at least one opening having a T-shape created through said layer of patterning material.

26. The method of claim 25, with an additional step of depositing a seed layer over inside surfaces of said at least one opening having a T-shape created through said layer of patterning material.

\* \* \* \* \*